United States Patent [19]

Lenox

[11] 4,240,066
[45] Dec. 16, 1980

[54] CYLINDRICAL ENCODER FOR USE WITH FIBER OPTICS

[75] Inventor: Thomas G. Lenox, South Windsor, Conn.

[73] Assignee: United Technologies Corporation, Hartford, Conn.

[21] Appl. No.: 48,430

[22] Filed: Jun. 14, 1979

[51] Int. Cl.³ .................. G05B 11/18; G06F 3/14; G08C 9/06
[52] U.S. Cl. .................. 340/870.29; 250/570; 340/347 P; 340/380
[58] Field of Search ............. 340/189 R, 189 M, 380, 340/190, 347 P; 235/473; 250/570; 60/237, 242

[56] References Cited

U.S. PATENT DOCUMENTS

| | | | |
|---|---|---|---|
| 3,744,048 | 7/1973 | Treichel | 340/380 |
| 3,853,089 | 12/1974 | Howard | 340/380 |
| 3,934,246 | 1/1976 | Mueller | 340/380 |
| 4,015,253 | 3/1977 | Goldstein | 250/570 |
| 4,076,379 | 2/1978 | Chouinard | 350/96.22 |
| 4,116,000 | 9/1978 | Martin et al. | 340/380 |
| 4,117,460 | 9/1978 | Walworth et al. | 340/380 |

*Primary Examiner*—Thomas A. Robinson
*Attorney, Agent, or Firm*—Robert C. Walker

[57] ABSTRACT

A fiber optic encoding device capable of long term reliable operation in hostile environments is disclosed. Various construction details which contribute to a compact device with high mechanical reliability are discussed. An encoder formed to a cylindrical geometry including a correspondingly shaped code plate is shown in detail. The code plate has a multiplicity of apertures arranged in rows to produce an encoded position signal of the type suitable for use in digital intelligence processing equipment.

4 Claims, 3 Drawing Figures

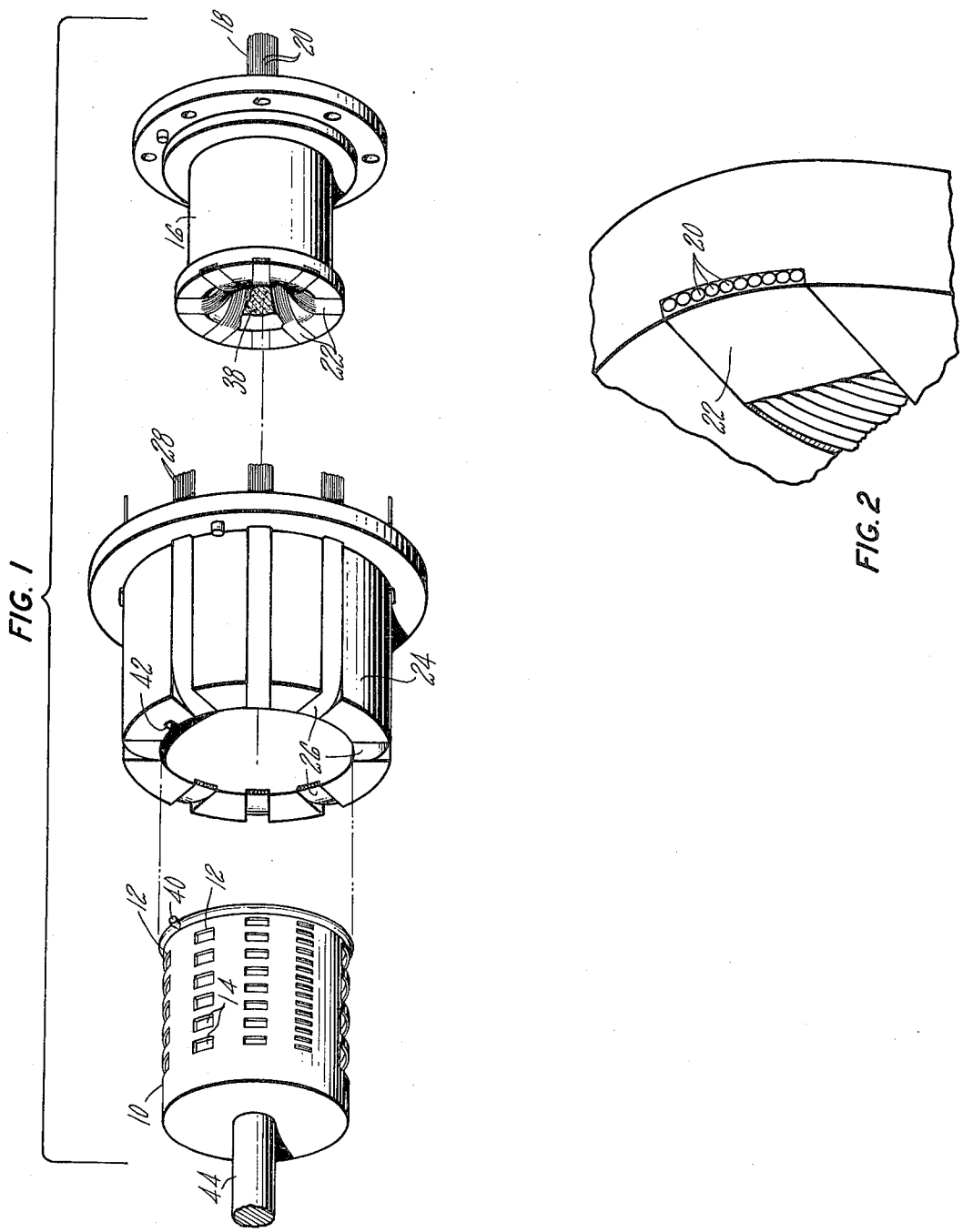

CYLINDRICAL ENCODER FOR USE WITH FIBER OPTICS

BACKGROUND OF THE INVENTION

1. Field of the Invention

This invention relates to fiber optic intelligence transmission, and more specifically to apparatus for encoding a position signal to be transmitted.

2. Description of the Prior Art

Modern industrial equipment has come to rely on sophisticated parameter controlling devices for optimization of operating characteristics. Critical to the operation of such parameter controlling devices is the precise position sensing of equipment subunits. For example, in modern gas turbine engines such controllable parameters include fuel flow, flowpath contour and pressure along the flowpath. Positionable units for controlling such parameters include fuel metering valves, moveable exhaust nozzles, and flowpath relief valves. In effective coordination of the variable parameters, it is essential that the actual position of the controlling units be continuously known.

The accuracy of the entire controlling system is, of course, largely dependent upon the accuracy of the position encoding devices which develop signals to be processed. Fiber optic systems are known to provide effective data transmission, particularly in hostile environments subject to electromagnetic interference and thermal fluctuations. One such hostile application is illustrated in U.S. Pat. No. 4,116,000 to Martin et al entitled "Engine Control System" which is of common assignee herewith. In the Martin et al patent the encoding device senses the position of the exhaust nozzle of a gas turbine engine. High temperatures at the exhaust nozzle and electromagnetic interference along the data transmission lines make fiber optic systems attractive for this application.

One inherent problem with fiber optic devices, however, is the packaging of the multiple channels required for encoding and transmitting bits of position information. A greater number of channels is desired for encoding more accurate position sensing. A lesser number of channels simplifies the encoder design and reduces the physical size of the encoder. One technique for reducing the number of channels without reducing the number of information bits is disclosed in U.S. Pat. No. 4,117,460 to Walworth et al entitled "Sensing Device", also of common assignee herewith. In the Walworth et al device the information signals are sequenced to provide multiple bits of information over each channel. The size of the transmission cable is reduced. The size of the encoding device, however, remains substantially unaltered. Both the Martin et al and Walworth et al patents illustrate flat plate encoders.

As more accurate sensing becomes desired, encoder size becomes an increasing problem. Each new channel, such as is added for accuracy, requires an additional aperture row on the encoder plate. An encoder plate of increased size results. Large encoder plates of a flat design not only tend to skew in their mounting tracks, but are also susceptible to thermal and vibratory distortions. Mechanical interferences impeding movement of the encoder plate may cause signal delays and hysteresis effects in the encoded signal. Significant clearance between transmitting and receiving heads of the encoder is provided in conventional systems to accommodate such anticipated distortions. Additionally, friction free mounting apparatus capable of providing precise alignment of the code plate tends to be large and bulky.

Manufacturers and designers of fiber optic encoders continue to search for new techniques that enable reductions in encoder size and for new packaging concepts which improve the mechanical operation of the code plate.

SUMMARY OF THE INVENTION

A primary aim of the present invention is to provide a fiber optic encoding device with improved packaging of the encoder plate. Good position resolution and reliable mechanical operation in an encoder of compact size is sought.

According to the present invention the code plate of a fiber optic encoding device is formed to a cylindrical geometry and is slidable between a transmitting head at the interior of the cylindrical code plate and a receiving head at the exterior of the code plate.

A primary feature of the present invention is the cylindrical code plate. Rows of apertures in the code plate are arranged to a binary or Gray code pattern capable of producing an encoded signal of the type suited for use in digital intelligence processing equipment. A transmitting head is disposed at the interior of the cylindrical code plate. A receiving head is disposed at the exterior of the code plate. The code plate is slideable in a key way to provide accurate radial alignment of the aperture rows with the transmitting and receiving heads. Light ways to the transmitting and receiving heads enter the encoder through a single optic connector.

A principal advantage of the present encoder is the ability of the device to encode an accurate signal of multibit information. Good resolution in a relatively small, attractive package is obtainable. The cylindrical shape of the code plate is more conducive to friction free mounting than is a flat plate containing an equivalent number of code rows. Thermal distortion of the code plate is substantially avoided by the cylindrical geometry of the plate. Transmission losses across the encoder are lessened by an enabled reduction in distance between the transmitting and receiving ways.

The foregoing, and other objects, features and advantages of the present invention will become more apparent in the light of the following detailed description of the preferred embodiment thereof as shown in the accompanying drawing.

BRIEF DESCRIPTION OF THE DRAWING

FIG. 1 is an exploded view illustrating a transmitting head, a code plate and a receiving head;

FIG. 2 is an enlarged view of one of the transmitting ways; and

DETAILED DESCRIPTION

Figure 3:
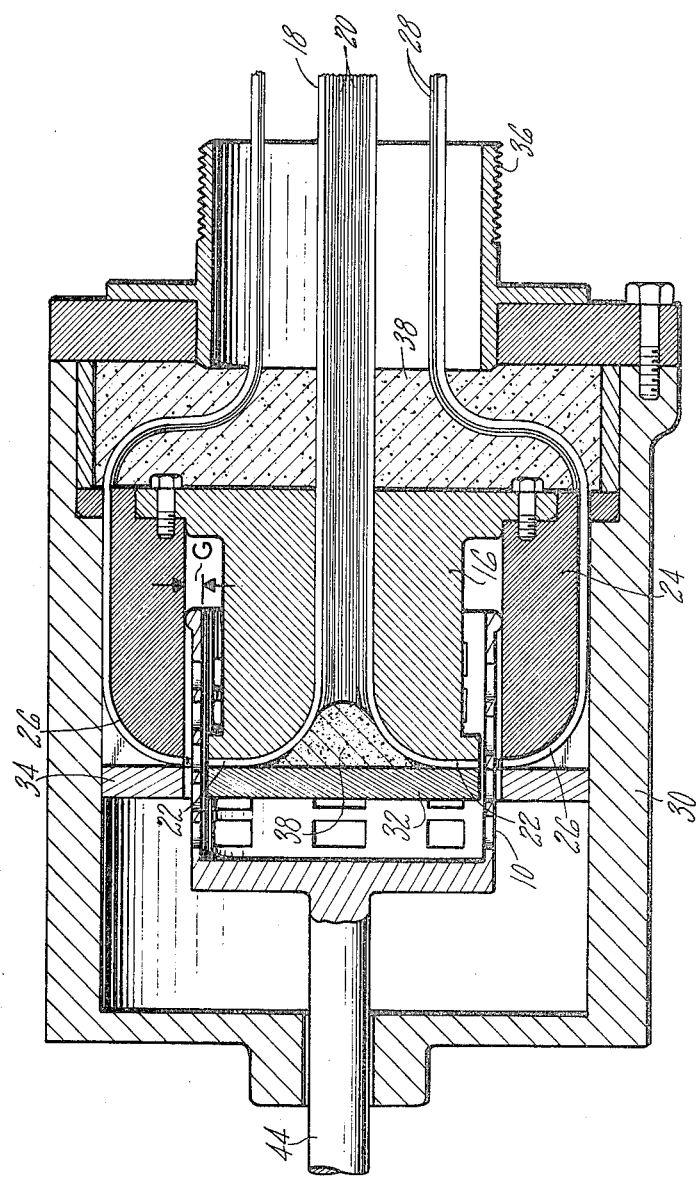
FIG. 3 is a simplified cross section view of typical encoding structure employing the concepts of the present invention.

The fundamental elements of one digital encoder constructed in accordance with the concepts of the present invention are illustrated in the FIG. 1 exploded view. A code plate 10 is formed to a cylindrical geometry and includes a plurality of aperture rows 12 which are spaced circumferentially about the periphery of the cylinder. The apertures 14 of each row are sized into a binary or Gray code pattern.

A transmitting head 16 is also formed to a cylindrical geometry and is sized such that the code plate 10 is slideable over the transmitting head. A bundle 18 of individual glass fibers 20 extends into the interior of the transmitting head and is divided into a plurality of discrete light ways 22. The number of light ways is equal to the number of aperture rows 12. The spacing of the ways corresponds to the spacing of the rows and each way is oriented so as to be capable of directing a column of light radially outwardly from the transmitting head toward the corresponding aperture row.

A receiving head 24 is also formed to a cylindrical geometry and is sized such that the code plate 10 is slidable within the receiving head. A plurality of discrete light ways 26 are spaced circumferentially about the receiving head. Each of the ways 26 opposes a corresponding way 22 of the transmitting head and is formed of a multiplicity of individual fibers 28. Each way 26 faces inwardly and is oriented so as to be capable of receiving an outwardly directed column of light. Eight (8) sets of opposing ways and aperture rows are illustrated. FIG. 2 illustrates one of the transmitting ways 22.

FIG. 3 illustrates the transmitting head 16, the code plate 10 and the receiving head 24 as encased in a typical structure. The receiving head is mounted within and is secured to a housing 30. The transmitting head is mounted within and is secured to the receiving head. The fibers 20 of bundle 18 pass into the interior of the transmitting head and are splayed radially outwardly into the ways 22 at one end of the transmitting head. An end plate 32 covers the fibers 20 at the end of the head. The fibers 28 of each way 26 of the receiving head are bent axially rearwardly at the end of the receiving head and extend longitudinally down the exterior of the receiving head. An end plate 34 covers the fibers 28 at the end of the receiving head. The ends of the fibers 20 of each way 22 oppose the ends of the fibers 28 of a corresponding way 26 across an annular gap G.

The fibers of the light ways are cemented within the respective heads and extend from the heads into the optic connector 36. The optic connector is of the general type illustrated in U.S. Pat. No. 4,076,379 to Chouinard entitled "Fiber Optic Connector" which is of common assignee herewith. Within the housing the fibers are supported by a plotting compound 38. The plotting compound in which the fibers are supported must be sufficiently flexible so as to accommodate limited angular deflection during handling of the device, yet sufficiently supportive so as to prevent fiber damage.

The code plate 10 is contained within the housing and is slideable in the gap G between the transmitting head and the receiving head. A protrusion such as the pin 40 slides within a keyway such as the slot 42 in the receiving head to align to aperture rows 12 with the corresponding transmitting and receiving ways. A code plate arm 44 extends from the code plate to the exterior of the housing. The arm is attachable to the device of which position is to be sensed. Translating movement of the device to be sensed causes a corresponding translation of the code plate between the transmitting and receiving heads.

Accurate position resolution is obtainable with a relatively small cylindrical device when compared to conventional flat plate encoder designs. For example, a one-half (½) inch stroke flat plate encoder capable of resolving position to within two thousandths (0.002) of an inch typically employs eight optic head apertures measuring two thousandths (0.002) of an inch by one-hundred-ninety-six thousandths (0.196) of an inch. An active code plate width of two and forty-eigth thousandths (2.048) inches, and an overall encoder assembly width, including support frame and alignment guides, of approximately three (3) inches results. In contrast, a cylindrical encoder configured as above would require a code plate of only sixty-five hundredths (0.65) of an inch in diameter, and an overall assembly diameter of less than one and one half (1.5) inches.

The cylindrical encoder plate is significantly stronger than an equivalent flat plate and may be manufactured to a reduced thickness. The plate is also significantly less susceptible to thermal distortion and less susceptible to vibratory deflection than a corresponding flat plate. Accordingly, the gap G required to enable interference free movement is reduced from the comparable gap required in flat plate encoders. Transmission efficiency is improved.

Collaterally, the code plate in a cylindrical configuration has a lesser mass than the code plate in a flat geometry, and is less susceptible to friction loads imposed by the plate mounting and guide structure. A decreased tendency toward the generation of hysteresis effects in the sensing apparatus results.

The cylindrical configuration facilitates integration of the encoder package into hydraulic actuation elements which are correspondingly cylindrically configured. Also, the cylindrical configuration improves ease of manufacture of closely toleranced encoder elements such that the gap G can be reduced to a minimal value which is significantly less than the corresponding gap of flat plate encoders.

Although the invention has been shown and described with respect to preferred embodiments thereof, it should be understood by those skilled in the art that various changes and omissions in the form and details thereof may be made therein without departing from the spirit and the scope of the invention.

Having thus described typical embodiments of my invention, that which I claim as new and desire to secure by Letters Patent of the United States is:

1. In a fiber optic encoding device of the type having a transmitting head including a plurality of light ways and a receiving head including a plurality of light ways corresponding to the light ways of the transmitting head and of the type having a code plate disposed between the transmitting and receiving heads for encoding a position signal, the improvement which comprises:
   a code plate formed to a cylindrical geometry and which effects encoding by being translated between the transmitting head and the receiving head; and
   transmitting and receiving heads oriented for transmission of an encoding signal radially across the cylindrical code plate.

2. The invention according to claim 1 wherein said code plate is slideable over said transmitting head and wherein each of said light ways of the transmitting head is oriented so as to be capable of directing a column of light radially outwardly from the transmitting head toward the code plate.

3. The invention according to claim 1 or 2 wherein said code plate is slideable within said receiving head and wherein each of said light ways of the receiving head is oriented so as to be capable of receiving the radially directed column of light from one of said light ways of the transmitting head.

4. A position encoding device of the fiber optic type, comprising:

a cylindrical transmitting head including a bundle of optic fibers extending into the interior of the head and splaying radially outwardly from the interior of the head to form a plurality of discrete light ways which are circumferentially spaced from one another and are oriented so as to be capable of directing columns of light radially outwardly from the transmitting head;

a cylindrical receiving head spaced radially from said transmitting head leaving an annular gap therebetween, the receiving head having a plurality of light ways spaced circumferentially in correspondence to said transmitting ways and oriented so as to be capable of receiving said radially directed columns of light from the transmitting head; and a cylindrical code plate which is slideable in a translating motion in the gap between said transmitting and receiving heads wherein the code plate has a plurality of aperture rows in correspondence to the light ways for enabling selected transmission of the light columns across the gap in response to the longitudinal position of the code plate within the gap.

* * * * *